(12) United States Patent
Kang

(10) Patent No.: US 8,994,701 B2
(45) Date of Patent: Mar. 31, 2015

(54) BACKLIGHT UNIT HAVING LIGHT EMITTING DIODE

(75) Inventor: Moonshik Kang, Yongin-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 844 days.

(21) Appl. No.: 13/206,940

(22) Filed: Aug. 10, 2011

(65) Prior Publication Data

US 2012/0229039 A1    Sep. 13, 2012

(30) Foreign Application Priority Data

Mar. 9, 2011   (KR) ........................ 10-2011-0020977

(51) Int. Cl.
| G06F 3/038 | (2013.01) |
| G09G 5/00 | (2006.01) |
| G09G 3/30 | (2006.01) |
| G09G 3/36 | (2006.01) |
| G09G 5/10 | (2006.01) |
| H05B 33/08 | (2006.01) |
| G05F 1/00 | (2006.01) |
| H05B 37/02 | (2006.01) |
| H05B 39/04 | (2006.01) |
| H05B 41/36 | (2006.01) |

(52) U.S. Cl.
CPC .................. H05B 33/0827 (2013.01)
USPC ............. 345/204; 315/291; 345/76; 345/102; 345/690

(58) Field of Classification Search
None
See application file for complete search history.

(56) References Cited

U.S. PATENT DOCUMENTS 7,072,096 B2 *  7/2006  Holman et al. ............... 359/298
8,564,507 B2 * 10/2013  Jang et al. ........................ 345/76
8,672,529 B2 *  3/2014  Choi et al. .................... 362/612

FOREIGN PATENT DOCUMENTS

| KR | 1020050060479 | 6/2005 |
| KR | 1020070092464 | 9/2007 |
| KR | 1020090054749 | 6/2009 |

* cited by examiner

Primary Examiner — Douglas W Owens
Assistant Examiner — Dedei K Hammond
(74) Attorney, Agent, or Firm — F. Chau & Associates, LLC

(57) ABSTRACT

A backlight unit has a Light Emitting Diode (LED). The backlight unit includes a base member, and a light source unit provided on the base member and including p light source blocks, where p is a natural number equal to or greater than 2. The light source blocks are sequentially arranged to emit light, and each of the light source blocks includes at least one LED package. The LED package includes an LED configured to generate light in response to a driving voltage applied from the outside. A main lead is connected to the LED and configured to apply the driving voltage to the LED. At least one sub lead is separated from the main lead and configured to provide the driving voltage to an adjacent light source block.

19 Claims, 6 Drawing Sheets

BACKLIGHT UNIT HAVING LIGHT EMITTING DIODE

CROSS-REFERENCE TO RELATED APPLICATION

This U.S. non-provisional patent application claims under 35 U.S.C. §119 priority to and the benefit of Korean Patent Application No. 10-2011-0020977, filed on Mar. 9, 2011, the entire content of which is incorporated by reference herein.

BACKGROUND

The present disclosure herein relates to a backlight unit provided with a Light Emitting Diode (LED), and, more particularly, to a backlight unit provided with an LED having a reduced size.

In the case of a non-emissive display device such as a Liquid Crystal Display (LCD), a display panel which displays an image cannot emit light by itself. Therefore, such a non-emissive display device is provided with a backlight unit for supplying light to the display panel. Generally, a backlight unit is provided with a Cold Cathode Fluorescent Lamp (CCFL) as a light source.

However, an LED has recently been adopted instead of a CCFL for a backlight unit to improve color reproducibility and reduce power consumption. A backlight unit that adopts an LED as a light source typically consists of multiple light source blocks which emit light, with each light source block including multiple LED packages connected in series.

The backlight unit provided with an LED can be classified into an edge type and a direct type according to the location of the LED packages. Edge type LED backlights have light sources located at the bottom side of the panels, while direct type LED backlights have light sources evenly distributed in the back of the panel. The backlight unit provided with an edge-type LED is currently being widely used to provide lighter and thinner display devices.

SUMMARY

The present disclosure provides a backlight unit provided with an LED having a reduced size.

According to an exemplary embodiment, a backlight unit for an LED display device includes a base member and a light source unit on the base member and having p light source blocks sequentially arranged to emit light, where p is a natural number equal to or greater than 2. Each of the light source blocks includes at least one LED package comprising an LED configured to generate light in response to a driving voltage applied from the outside, a main lead connected to the LED and configured to apply the driving voltage to the LED, and at least one sub lead separated from the main lead and configured to provide the driving voltage to an adjacent light source block.

The LED package may further include a body unit configured to fix the LED, the main lead, and the sub lead.

The LED package may further include a penetration hole provided in the body unit and configured to expose the LED toward a surface of the base member, and a heat sink provided in the penetration hole.

The LED may include a first electrode and a second electrode. The main lead may include a first main lead connected to the first electrode, and a second main lead separated from the first main lead and connected to the second electrode. The driving voltage may be applied to the first main lead, and a reference voltage lower than the driving voltage may be applied to the second main lead.

The backlight unit may further include a ground wiring to which the reference voltage is applied from the outside. The second main lead may be connected to the ground wiring.

The backlight unit may further include a heat release chassis combined to an opposed surface of the base member. The opposed surface may face a surface on which the light source blocks are situated.

The reference voltage may be applied to the heat release chassis, and the second main lead may be connected to the heat release chassis.

Each of the light source blocks may include k LED packages connected in series, where k is a natural number equal to or greater than 2.

Multiple sub leads may be provided. The main lead included in a first LED package of an nth light source block among the light source blocks may be connected to one of the sub leads included in a kth LED package of an (n−1)th light source block, where n is a natural number equal to or greater than 2, and the sub leads included in the first LED package of the nth light source block may be connected to the sub leads included in the kth LED package of the (n−1)th light source block.

The number of connections between the sub leads included in the first LED package of the nth light source block and the number sub leads included in the kth LED package of the (n−1)th light source block may be greater by 1 than the number of connections between the sub leads included in the kth LED package of the nth light source block and the sub leads included in a first LED package of an (n+1)th light source block.

Each of the LED packages may include as much as (p−1) sub leads.

A first wiring may be provided to the base member and configured to connect the sub leads of adjacent LED packages in each of the light source blocks to each other. A second wiring may be configured to connect the main leads of the adjacent LED packages to each other.

A third wiring may be provided to the base member and configured to connect the main lead included in a first LED package of a nth light source block among the p light source blocks to one of the sub leads included in a kth LED package of a (n−1)th light source block, where n is a natural number equal to or greater than 2. Fourth wirings may be configured to connect the sub leads included in the first LED package of the nth light source block to the sub leads included in the kth LED package of the (n−1)th light source block.

The backlight unit further include a driving circuit configured to provide the driving voltage to the light source blocks.

The driving circuit may include a voltage boosting circuit configured to boost an externally-applied input voltage and output the driving voltage, a switching unit configured to selectively provide the driving voltage to the light source blocks, and a dimming circuit configured to turn on and off the switching unit.

The switching unit may include as many switching elements as the number of the light source blocks.

The backlight unit may further include a light guide plate configured to receive light emitted from the light source unit through at least one side and emit the received light through an emitting surface.

The light emitting surface of the LED package may be substantially parallel with the one side of the light guide plate.

The backlight unit may further include a diffusion sheet on the emitting surface of the light guide plate, and a reflective sheet under a surface facing the emitting surface of the light guide plate.

According to an exemplary embodiment an LED backlight unit for an LED display device includes multiple light source blocks mounted on a base member, each light source block comprising multiple LED packages, each LED package having a body unit for mounting an LED on the base member. The body unit includes a groove part having tapered walls, the LED being mounted within the groove part such that light emitted by the LED can be both transmitted directly from body unit and also reflected by the walls of groove part and then transmitted from body unit. A main lead is connected to the LED and configured to apply a driving voltage to the LED and at least one sub lead is separated from the main lead and configured to provide the driving voltage to an adjacent light source block.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
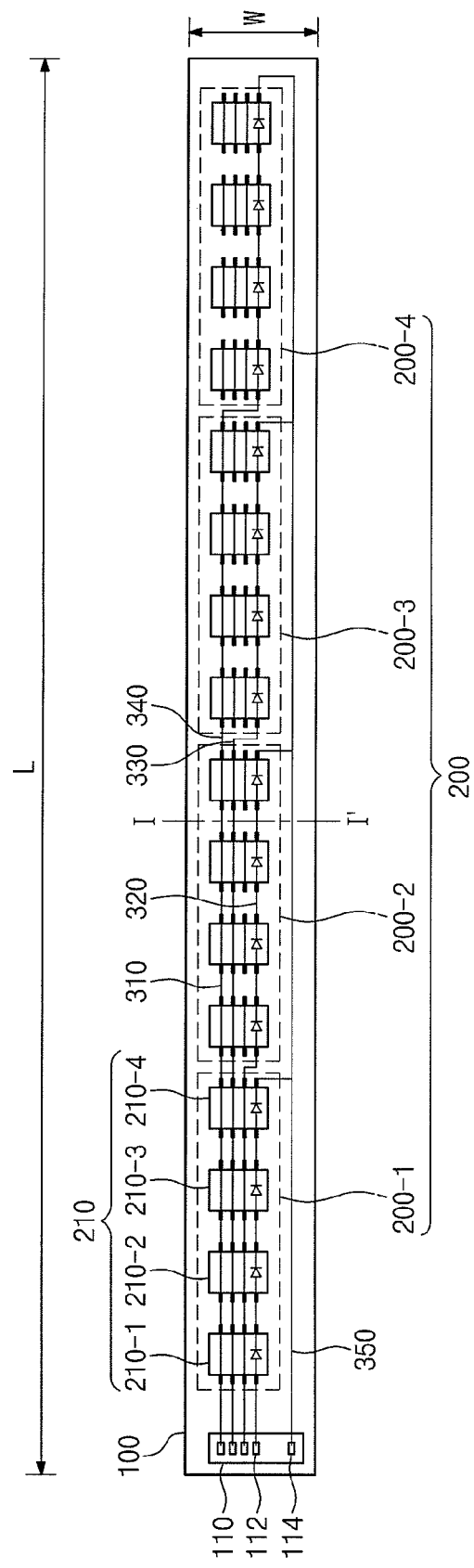
FIG. 1 is a planar diagram illustrating a backlight unit provided with a Light Emitting Diode (LED) according to an embodiment of the inventive concept.

Exemplary embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

Like reference numerals refer to like elements throughout. In the drawings, the dimensions of layers and regions are exaggerated for clarity of illustration. The terms "first", "second", and the like may be used for explaining various elements; however, those elements should not be limited by the terms. The terms are used just for distinguishing one element from another. For instance, without departing the scope of the inventive concept, a first element may be named as a second element, and likewise, the second element may be named as the first element. The terms of a singular form include plural forms unless otherwise specified.

The meaning of "include," "comprise," "including," or "comprising," specifies a property, a region, a fixed number, a step, a process, an element and/or a component but does not exclude other properties, regions, fixed numbers, steps, processes, elements and/or components. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present.

Referring to FIGS. 1 to 4, the backlight unit provided with an LED (hereinafter, simply referred to as backlight unit) includes a base member 100, and a light source unit 200 including p light source blocks 200-1, . . . 200-4 (p being a natural number equal to or greater than 2) on base member 100. Herein, each of the light source blocks 200-1, . . . 200-4 includes at least one LED package 210.

Although it is illustrated in FIG. 1 that the light source unit 200 includes four light source blocks 200-1, . . . 200-4, and each of the light source blocks 200-1, . . . 200-4 includes four LED packages 210-1, . . . 210-4, this is just one exemplary embodiment, and the number of the light source blocks and the number of LED packages may be changed within the above mentioned groupings.

The LED packages 210 are mounted on one side of the base member 100. The base member 100 is a planar member constituting a frame of the backlight unit. A resin substrate, or a metal substrate on which a metal oxide layer is formed, e.g., an aluminum substrate where an oxide aluminum layer or alumina layer is formed, may be adopted for the base member 100.

The light source blocks 200-1, . . . 200-4 are sequentially arranged and emit light. As illustrated in FIG. 1, when the shape of the base member 100 is rod-like having a length L greater than a width W, the light source blocks 200-1, . . . 200-4 are arranged in a length direction along base member 100.

Figure 3:
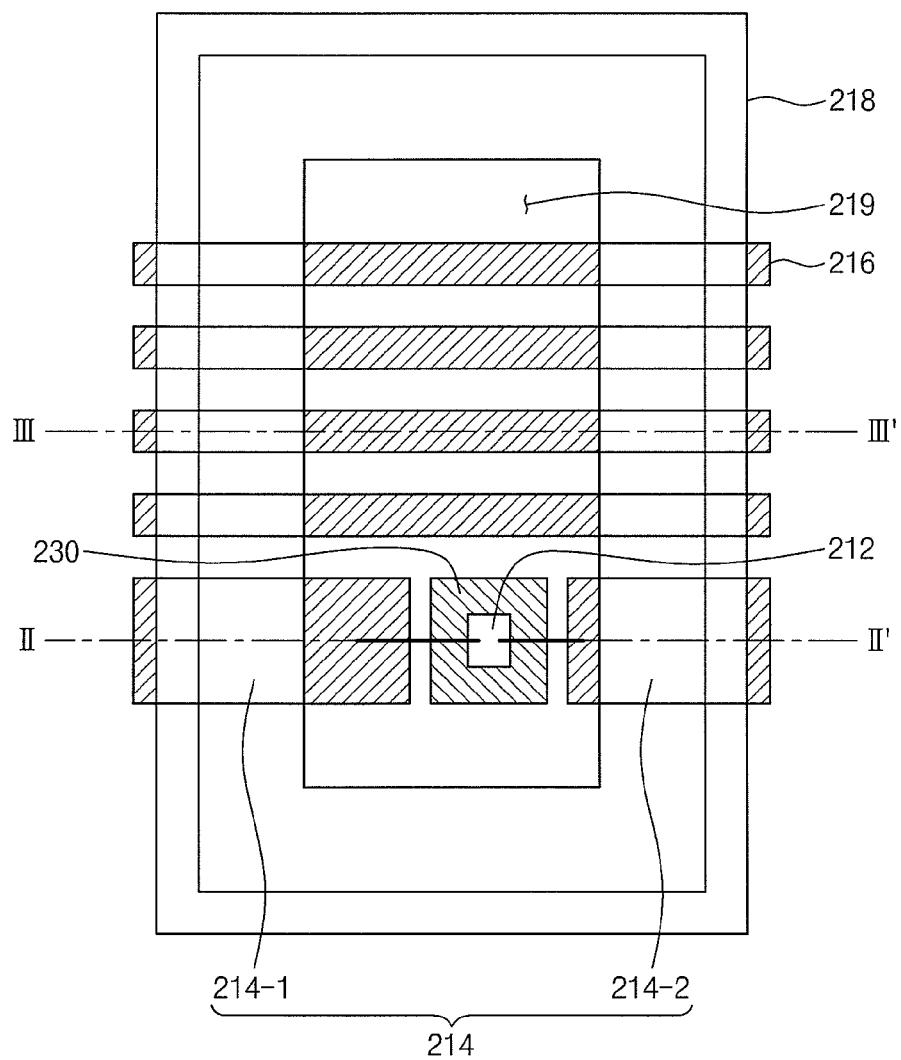
FIG. 3 is a planar diagram illustrating an LED package included in the backlight unit of FIG. 1.

As described above, the light source blocks 200-1, . . . 200-4 are provided with one or more LED packages 210. The LED package 210 includes an LED 212, a main lead 214 and at least one sub lead 216, as seen in FIG. 3.

Figure 4A:
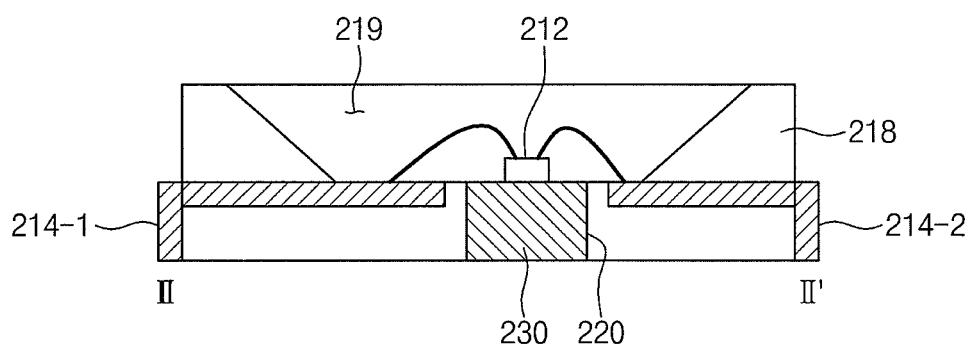
FIGS. 4A and 4B are cross-sectional views of the LED package sectioned along II-II' and III-III' of FIG. 3 respectively.
Figure 4B:
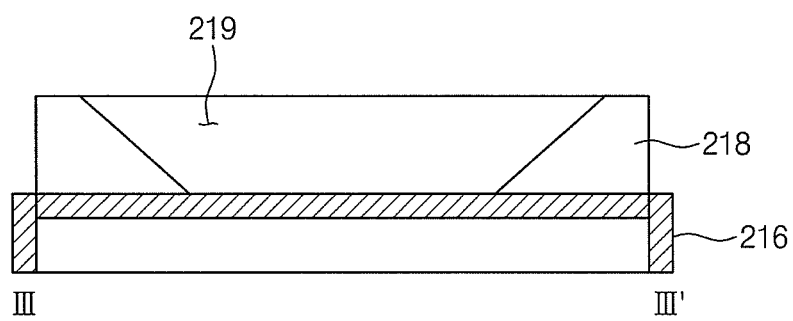

Hereinafter, an exemplary LED package 210 will be described in more detail referring to FIGS. 3, 4A and 4B. The LED 212 is a semiconductor device which generates light in response to a driving voltage applied from the outside. Light is generated by the LED 212 when it is forward biased (switched on), such that electrons are able to recombine with electron holes within the device, releasing energy in the form of photons. This effect is called electroluminescence.

Although not illustrated in the drawing, the LED 212 has a structure where an N-type semiconductor layer, an active layer and a P-type semiconductor layer are sequentially layered. Also, a P-type electrode (hereinafter, referred to as first electrode) connected to the P-type semiconductor layer, and an N-type electrode (hereinafter, referred to as second electrode) connected to the N-type semiconductor layer are further included.

The main lead 214 is connected to the LED 212 to apply the driving voltage to the LED 212. The main lead 214 may include a first main lead 214-1 connected to the first electrode and a second main lead 214-2 connected to the second electrode. The first and second main leads 214-1, 214-2 are separated from each other, and, in an exemplary embodiment, may be respectively connected to the first and second electrodes by a wire bonding method. The driving voltage can be applied to the first main lead 214-1, and a reference voltage, e.g., ground voltage, lower than the driving voltage can be applied to the second main lead 214-2.

The sub lead 216 is separated from the main lead 214, and provides the driving voltage to an adjacent light source block. That is, the LED package 210 includes the main lead 214 providing the driving voltage to the LED 212, and the sub lead 216 providing the driving voltage to the adjacent light source block.

As illustrated in FIG. 1, among the four light source blocks 200-1, . . . 200-4, the second, third and fourth light source blocks 200-2, 200-3, 200-4 are provided with the driving voltage through the first light source block 200-1, through the first and second light source blocks 200-1, 200-2, and through the first to third light source blocks 200-1, 200-2, 200-3, respectively. Therefore, wiring for providing the driving voltage directly to each of the light source blocks 200-1, . . . 200-4 may be omitted in the backlight unit, and thus, the width of the base member 100 can be reduced.

The LED package 210 further includes a body unit 218 which fixes the LED 212, the main lead 214 and the sub lead 216. The body unit 218 may be composed of resin. Each end-part of the main lead 214 and the sub lead 216 is exposed to the outside of the body unit 218. Also, as illustrated in FIGS. 3, 4A and 4B, the body unit 218 is provided with a groove part 219, and the LED 212 may be situated in the groove part 219. Groove part 219 have tapered walls, which may be of a reflective material such that light emitted by LED 212 can be both transmitted directly from body unit 218 or first reflected by the walls of groove part 219 and then transmitted from body unit 218.

The body unit 218 may be provided with a through hole 220 exposing the LED 212 toward a surface of the base member 100, and a heat sink 230 may be disposed in the through hole 220. The LED 212 is mounted on the heat sink 230 as illustrated in FIG. 4A. The heat sink 230 releases heat generated from the LED to the outside, and thus prevents malfunctioning of the LED.

The driving voltages provided to the p light source blocks are applied to the first light source block from the outside. In more detail, as illustrated in FIG. 1, the driving voltages are applied to the main leads 214 and the sub leads 216 of the LED package 210 included in the first light source block 200-1. As described above, the driving voltage applied to the main lead 214 operates the LED 212, and the driving voltage applied to the sub leads 216 are provided to the adjacent light source blocks 200-2, . . . 200-4 through the sub leads 216.

The driving voltage may be applied to the first light source block 200-1 through a connector 110 provided to one end-part of the base member 100, as seen in FIG. 1. The connector 110 includes connection pins 112 at least as much as the number of the light source blocks 200-1, . . . 200-4. The connection pins 112 are electrically connected to the main lead 214 and the sub lead 216 of the LED package 210 included in the first light source block 200-1. Accordingly, the driving voltage applied to the connection pins 112 is provided to the first light source block 200-1.

Figure 2:
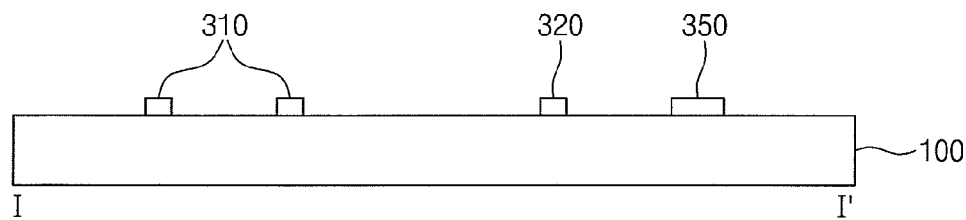
FIG. 2 is a cross-sectional view of the backlight unit sectioned along I-I' of FIG. 1.

Also, a ground wiring 350, to which a reference voltage whose potential is lower than that of the driving voltage is applied from the outside, may be provided to one side of the base member 100 as illustrated in FIG. 2. The second main lead 214-2 included in the LED package 210 is connected to the ground wiring 350, and the reference voltage is applied to the second main lead 214-2. If the connector 110 is provided with a ground pin 114 to which the reference voltage is applied from the outside, an end-part of the ground wiring is connected to the ground pin 114.

As described above, each light source block may include k LED packages connected in series (k being a natural number equal to or greater than 2).

As illustrated in FIG. 1, if each of the light source blocks 200-1, . . . 200-4 includes four LED packages 210-1, . . . 210-4, the four LED packages 210-1, . . . 210-4 generate light with the same driving voltage. That is, the LED packages 210-1, . . . 210-4 included in one light source block generate light simultaneously. However, the light source blocks 200-1, . . . 200-4 may or may not simultaneously generate the light.

Each of the LED packages 210 included in one light source block includes a plurality of sub leads 216 to provide the driving voltage to adjacent light source blocks 200-1, . . . 200-4. In an exemplary embodiment each of the LED packages 210 includes a quantity of the sub leads 216 at least as much as one less than the number of the light source blocks 200-1, . . . 200-4.

The main lead included in a first LED package of an nth light source block among the light source blocks (n being a natural number equal to or greater than 2) is connected to one of the sub leads included in a kth LED package of an (n−1)th light source block, and the sub leads included in the first LED package of the nth light source block are connected to the sub leads included in the kth LED package of the (n−1)th light source block.

For instance, as illustrated in FIGS. 1 to 4, the main lead 214 included in the first LED package 210-1 of the second light source block 200-2 is connected to one of three sub leads 216 included in the fourth LED package 210-4 of the first light source block 200-1. Also, the sub leads 216 included in the first LED package 210-1 of the second light source block 200-2 are connected to the sub leads 216 included in the fourth LED package 210-4 of the first light source block 200-1.

In an exemplary embodiment the number of connections between the sub leads included in the first LED package of the nth light source block and the sub leads included in the kth LED package of the (n−1)th light source block is greater than the number of connections between the sub leads included in the kth LED package of the nth light source block and the sub leads included in the first LED package of the (n+1)th light source block by one. That is, the number of electrical connections between adjacent light source blocks is reduced as the connection becomes closer to the pth light source block from the first light source block.

For instance, as illustrated in FIGS. 1 to 4, the number of connections between the sub leads 216 included in the first LED package 210-1 of the second light source block 200-2 and the sub leads 216 included in the fourth LED package 210-4 of the first light source block is three, and the number of connections between the sub leads 216 included in the fourth LED package 210-4 of the second light source block 200-2 and the sub leads 216 included in the first LED package 210-1 of the third light source block 200-3 is two.

The leads 214, 216 may be directly connected to each other for electrically connecting the main leads 214 and the sub leads 216, or the sub leads 216 of one LED package and the sub leads 216 of another LED package. However, in an exemplary embodiment the main leads 214 and the sub leads 216 can make connections through wirings 310, . . . 340 provided on the base member 100. The wirings 310, . . . 340 are composed of conductive material such as copper (Cu), and may be formed through plating and etching processes.

First, connections between the leads in a single light source block are described. As illustrated in FIGS. 1 to 4, in each of the light source blocks 200-1, . . . 200-4, the first wiring 310 connects the sub leads 216 of adjacent LED packages with each other, and the second lead 320 connects the main leads 214 of the adjacent LED packages with each other.

Next, connections between adjacent light source blocks are described. The third wiring 330 connects the main lead included in the first LED package of the nth light source block to one of the sub leads included in the kth LED package of the (n−1)th light source block. Also, the fourth wirings 340 connect the sub leads included in the first LED package of the nth light source block to the sub leads included in the kth LED package of the (n−1)th light source block.

For instance, as illustrated in FIGS. 1 to 4, the third wiring 330 connects the main lead 214 included in the first LED package 210-1 of the second light source block 200-2 to one of the sub leads 216 included in the fourth LED package 210-4 of the first light source block 200-1. Also, the fourth wiring 340 connects the sub leads 216 included in the first LED package 210-1 of the second light source block 200-2 to the sub leads 216 included in the fourth LED package 210-4 of the first light source block 200-1.

Figure 5:
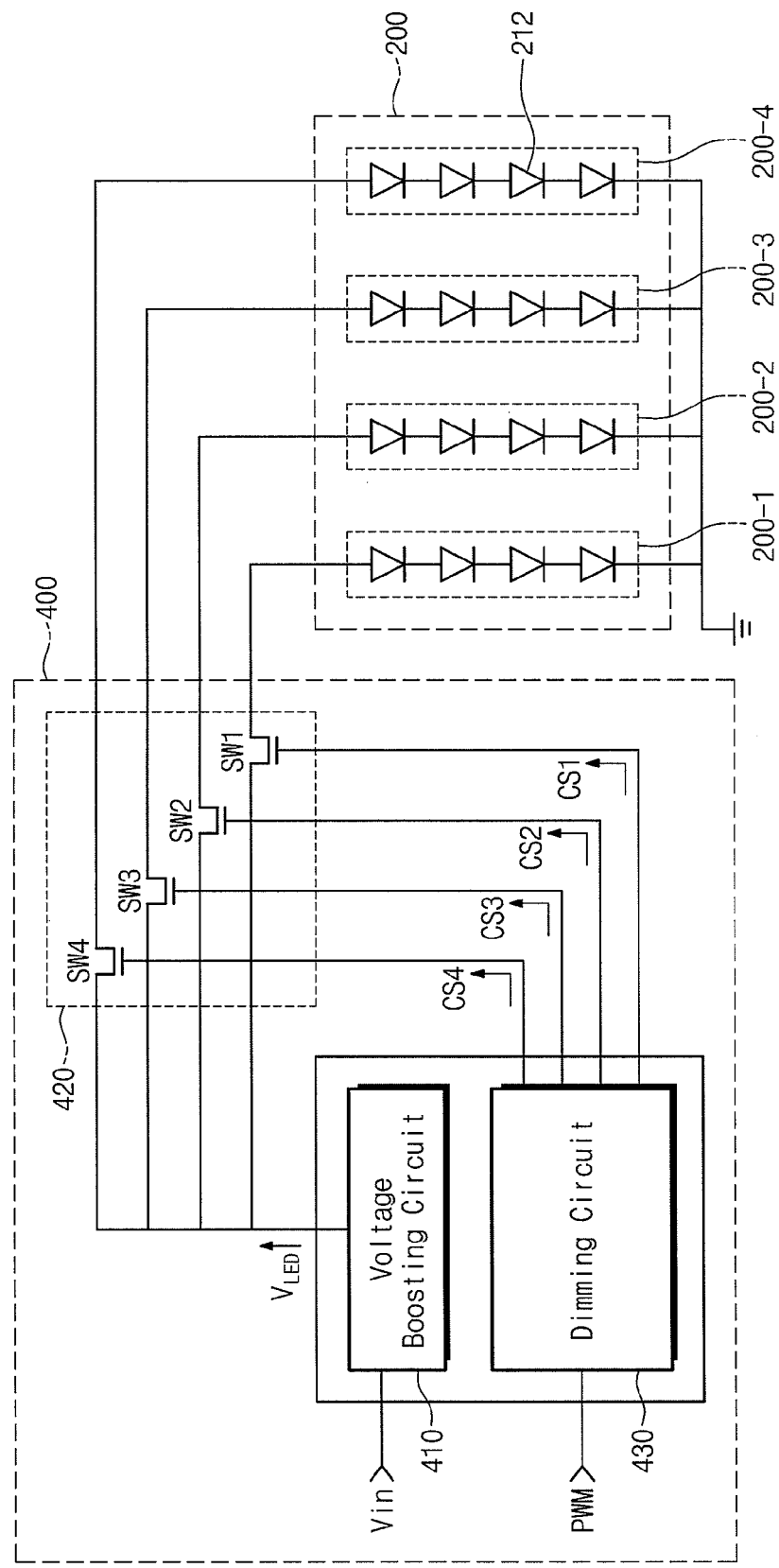
FIG. 5 is a circuit diagram illustrating the backlight unit shown in FIG. 1.

FIG. 5 is a circuit diagram illustrating the backlight unit shown in FIG. 1. The backlight unit further includes a driving circuit 400 providing the driving voltage to the light source blocks 200-1, . . . 200-4.

The driving circuit 400 includes a voltage boosting circuit 410 which boosts an input voltage to output the driving voltage, a switching unit 420 which selectively provides the driving voltage to the light source blocks 200-1, . . . 200-4, and a dimming circuit 430 which controls the switching unit 420 to turn it on and off.

The voltage boosting circuit 410 receives an input voltage Vin from the outside, and boosts the input voltage Vin to the driving voltage $V_{LED}$ appropriate for driving the LED packages 210.

The dimming circuit 430 receives a dimming signal PWM from the outside, and outputs control signals, e.g., first to fourth control signals CS1, . . . CS4, for controlling overall brightness or each block brightness of the light source block 200 in response to the dimming signal PWM. The first to fourth control signals CS1, . . . CS4 are provided to the switching unit 420. According to the dimming signal PWM, each high level period of the first to fourth control signals CS1, CS4 may be adjusted.

The switching unit 420 selectively provides the driving voltage $V_{LED}$ to the light source blocks according to the control signals. The switching unit 420 includes switching elements SW1, . . . SW4 as much as the number of the light source blocks 200-1, . . . 200-4. Each of the switching elements SW1, . . . SW4 includes a first electrode connected to an output terminal of the voltage boosting circuit 410 to receive the driving voltage $V_{LED}$, a second electrode receiving the control signals CS1, . . . CS4 from the dimming circuit 430, and a third electrode connected to the first light source block 200-1. When the connector 110 is included as illustrated in FIG. 1, the third electrodes of the switching elements SW1, . . . SW4 are respectively connected to the connection pins 112 included in the connector 110.

As described above, since the connection pins 112 are connected to the main lead 214 and the sub leads 216 of the LED package 210 included in the first light source block 200-1, the driving voltage $V_{LED}$ is selectively provided to the light source blocks 200-1, . . . 200-4.

Figure 6:
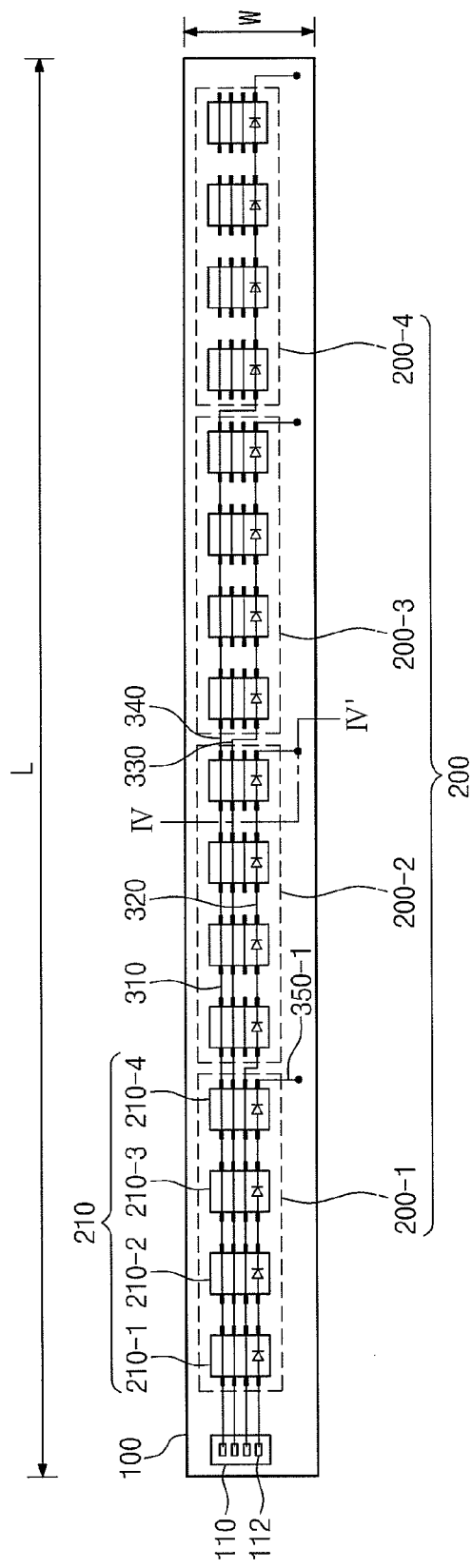
FIG. 6 is a planar diagram illustrating a backlight unit according to another embodiment of the inventive concept.
Figure 7:
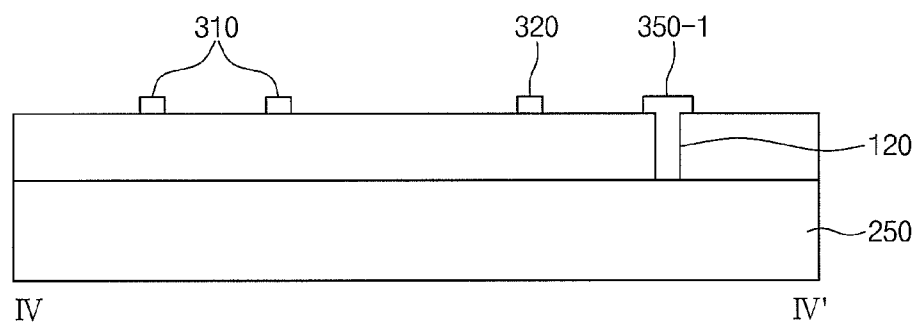
FIG. 7 is a cross-section view of the backlight unit sectioned along IV-IV' of FIG. 6.

FIG. 6 is a planar diagram illustrating a backlight unit according to an exemplary embodiment of the inventive concept, and FIG. 7 is a cross-section view of the backlight unit sectioned along IV-IV' of FIG. 6. Referring to FIGS. 6 and 7, the backlight unit further includes a heat release chassis 250 combined to one surface of the base member 100 facing the other surface onto which the light source blocks 200-1, . . . 200-4 are provided. The heat release chassis 250 is a metal member, and radiates heat generated from the LED to the outside. In an exemplary embodiment the heat release chassis 250 has the same shape as the base member 100, and it may be combined to the base member 100 with a resin adhesive.

Also, a reference voltage may be applied to the heat release chassis 250, and the second main lead 214-2 (see FIGS. 3 and 4) included in the LED package 210 may be connected to the heat release chassis 250.

As illustrated in FIG. 7, a grounding hole 120 which penetrates through the base member 100 is provided, and a ground wiring 350-1 connects the second main lead 214-2 and the heat release chassis 250 via the grounding hole 120 so that the second main lead 214-2 is grounded. The grounding hole 120 may be formed using a mechanical drill or a laser drill, and the ground wiring 350-1 may be formed through plating and etching processes.

Since the second main lead 214-2 is grounded to the heat release chassis 250 as described above, a structure of the ground wiring 350-1 provided to the base member 100 is simplified, and heat radiation performance of the backlight unit is improved.

Figure 8:
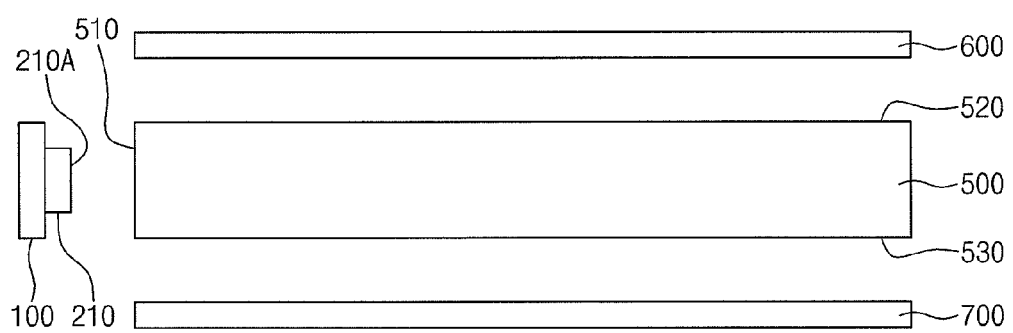
FIG. 8 is a side-view illustrating a backlight unit according to still another embodiment of the inventive concept.

FIG. 8 is a side-view illustrating a backlight unit according to still an exemplary embodiment of the inventive concept. As illustrated in FIG. 8, the backlight unit further includes a light guide plate 500. The light guide plate 500 receives light emitted from the light source unit 200 (see FIG. 1) through at least one side 510 and emits the received light through an emitting surface 520.

The light guide plate 500 may be formed in a quadrilateral plate shape. The light guide plate 500 includes a side 510 adjacent to the light source blocks 200-1, . . . 200-4, the emitting surface 520 extended from one end of the side 510, and a reflective surface 530 which is parallel with the emitting surface 520 and extended from the other end of the side 510.

The light emitted from the light source blocks 200-1, . . . 200-4 is incident to the side 510 of the light guide plate 500, and the light incident into the light guide plate 500 through the side 510 is emitted to the outside directly through the emitting surface 520, or reflected by the reflective surface 530 and then emitted through the emitting surface 520.

For improving efficiency of concentrating light incident to the light guide plate 500, in an exemplary embodiment each light emitting surface 210A of the LED packages 210 included in each of the light source blocks 200-1, . . . 200-4 is parallel with the side 510 of the light guide plate 500.

Also, the backlight unit may further include a diffusion sheet 600 disposed on the emitting surface 520, and a reflective sheet 700 disposed under the reflective surface 530. The reflective sheet 700 re-reflects light leaked from the light guide plate 500 to the light guide plate 500, and the diffusion sheet 600 diffuses the light emitted from the light guide plate 500, thereby improving brightness of the backlight unit.

Although it is illustrated in FIG. 8 that the backlight unit includes the single light source unit 200 adjacent to one side of the light guide plate 500, the backlight unit may include at least two light source units 200 adjacent to at least two sides of the light guide plate 500 respectively.

The above-described backlight unit is provided with the light source blocks on the base member, and each of the light source blocks includes at least one LED package which generates light with a driving voltage applied from the outside. The LED package includes at least one sub lead for providing the driving voltage to an adjacent light source block, and thus a size of the base member is reduced.

Also, since the LED package includes the sub lead, wirings for providing the driving voltage to each of the light source blocks can be omitted. Accordingly, a structure of the backlight unit is simplified.

The above-disclosed subject matter is to be considered illustrative and not restrictive, and the appended claims are intended to cover all such modifications, enhancements, and other embodiments, which fall within the true spirit and scope of the inventive concept.

What is claimed is:

1. A backlight unit for a Light Emitting Diode (LED) display device, the backlight unit comprising:
   a base member; and
   a light source unit on the base member and comprising p light source blocks sequentially arranged to emit light, where p is a natural number equal to or greater than 2,
   wherein each of the light source blocks comprises at least one LED package, the LED package comprising:
      an LED configured to generate light in response to a driving voltage applied from the outside,
      a main lead connected to the LED and configured to apply the driving voltage to the LED,
      at least one sub lead separated from the main lead and configured to provide the driving voltage to an adjacent light source block, and
      a body unit configured to fix the LED, the main lead, and the sub lead,
      wherein the main lead and the sub lead overlap the body unit in planar.

2. The backlight unit of claim 1, wherein the LED package further comprises a penetration hole provided in the body unit and configured to expose the LED toward a surface of the base member, and a heat sink provided in the penetration hole.

3. The backlight unit of claim 1, wherein the LED comprises a first electrode and a second electrode, the main lead comprises a first main lead connected to the first electrode, and a second main lead separated from the first main lead and connected to the second electrode, and the driving voltage is applied to the first main lead, and a reference voltage lower than the driving voltage is applied to the second main lead.

4. The backlight unit of claim 3, further comprising a ground wiring to which the reference voltage is applied from the outside, wherein the second main lead is connected to the ground wiring.

5. The backlight unit of claim 3, further comprising a heat release chassis combined to an opposed surface of the base member, wherein the opposed surface faces a surface on which the light source blocks are situated.

6. The backlight unit of claim 5, wherein: the reference voltage is applied to the heat release chassis, and the second main lead is connected to the heat release chassis.

7. The backlight unit of claim 1, each of the light source blocks includes k LED packages connected in series, where k is a natural number equal to or greater than 2.

8. The backlight unit of claim 7, wherein: multiple sub leads are provided, the main lead included in a first LED package of an nth light source block among the light source blocks is connected to one of the sub leads included in a kth LED package of an (n−1)th light source block, where n is a natural number equal to or greater than 2, and the sub leads included in the first LED package of the nth light source block are connected to the sub leads included in the kth LED package of the (n−1)th light source block.

9. The backlight unit of claim 8, wherein the number of connections between the sub leads included in the first LED package of the nth light source block and the number of sub leads included in the kth LED package of the (n−1)th light source block is greater by 1 than the number of connections between the sub leads included in the kth LED package of the nth light source block and the sub leads included in a first LED package of an (n+)th light source block.

10. The backlight unit of claim 8, wherein each of the LED package comprises as much as (p−1) sub leads.

11. The backlight unit of claim 7, further comprising:
   a first wiring provided to the base member and configured to connect the sub leads of adjacent LED packages in each of the light source blocks to each other; and
   a second wiring configured to connect the main leads of the adjacent LED packages to each other.

12. The backlight unit of claim 11,
   wherein multiple sub leads are provided, and
   further comprising:
      a third wiring provided to the base member and configured to connect the main lead included in a first LED package of a nth light source block among the p light source blocks to one of the sub leads included in a kth LED package of a (n−1)th light source block, where n is a natural number equal to or greater than 2; and
      fourth wirings configured to connect the sub leads included in the first LED package of the nth light source block to the sub leads included in the kth LED package of the (n−1)th light source block.

13. The backlight unit of claim 1, further comprising a driving circuit configured to provide the driving voltage to the light source blocks.

14. The backlight unit of claim 13, wherein the driving circuit comprises:
   a voltage boosting circuit configured to boost an externally-applied input voltage and output the driving voltage;
   a switching unit configured to selectively provide the driving voltage to the light source blocks; and
   a dimming circuit configured to turn on and off the switching unit.

15. The backlight unit of claim 14, wherein the switching unit comprises as many switching elements as the number of the light source blocks.

16. The backlight unit of claim 1, further comprising a light guide plate configured to receive light emitted from the light source unit through at least one side and emit the received light through an emitting surface.

17. The backlight unit of claim 16, wherein a light emitting surface of the LED package is substantially parallel with the one side of the light guide plate.

18. The backlight unit of claim 17, further comprising:
   a diffusion sheet on the emitting surface of the light guide plate; and
   a reflective sheet under a surface facing the emitting surface of the light guide plate.

19. A light emitting diode (LED) backlight unit for an LED display device, the LED backlight unit comprising:
   multiple light source blocks mounted on a base member, each light source block comprising multiple LED packages,
   wherein each LED package has a body unit for mounting an LED on the base member, a main lead connected to the LED, and at least one sub lead separated from the main lead,
   wherein the body unit comprises a groove part having tapered walls, the LED being mounted within the groove part such that light emitted by the LED can be both transmitted directly from body unit and also reflected by the walls of groove part and then transmitted from body unit, wherein the main lead is configured to apply a driving voltage to the LED and the sub lead is configured to provide the driving voltage to an adjacent light source block, and wherein the main lead and the sub lead overlap the groove part in planar.

* * * * *